(12) United States Patent
Hasegawa et al.

(10) Patent No.: US 7,521,167 B2
(45) Date of Patent: Apr. 21, 2009

(54) ESTER GROUP-CONTAINING POLY (IMIDE-AZOMETHINE) COPOLYMER, ESTER GROUP-CONTAINING POLY (AMIDE ACID-AZOMETHINE) COPOLYMER, AND POSITIVE PHOTOSENSITIVE RESIN COMPOSITION

(75) Inventors: Masatoshi Hasegawa, Chiba (JP); Junichi Ishii, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 161 days.

(21) Appl. No.: 11/433,436

(22) Filed: May 15, 2006

(65) Prior Publication Data
US 2006/0269868 A1 Nov. 30, 2006

(30) Foreign Application Priority Data

May 24, 2005 (JP) ............................. 2005-151607
Sep. 16, 2005 (JP) ............................. 2005-270479
Sep. 20, 2005 (JP) ............................. 2005-271953

(51) Int. Cl.
*G03F 7/023* (2006.01)
*G03F 7/30* (2006.01)
*C08G 69/26* (2006.01)

(52) U.S. Cl. ..................... 430/192; 430/193; 430/270.1; 430/313; 430/326; 430/330; 528/266; 528/353

(58) Field of Classification Search .................. 430/192, 430/193, 270.1, 313, 326, 330; 528/266, 528/353
See application file for complete search history.

(56) References Cited

U.S. PATENT DOCUMENTS 5,066,765 A * 11/1991 Wada et al. .................. 528/185
5,409,793 A * 4/1995 Sacripante et al. ....... 430/109.5
6,001,517 A * 12/1999 Kawamonzen ................ 430/18
2007/0254245 A1* 11/2007 Hasegawa et al. ........... 430/434

FOREIGN PATENT DOCUMENTS

| JP | A-64-079233 | 3/1989 |
| JP | A-02-042372 | 2/1990 |
| JP | A-2002-161136 | 6/2002 |

OTHER PUBLICATIONS

Suematsu et al.; "Syntheses of CH=N Double Bond Containing Polymers (Polyimine) by the Codensation of Diamines and Dialdehydes;" *Organic Synthetic Chemistry*;vol. 41; 1983; pp. 972-984.

Saegusa et al.; "Preparation and characterization of fluorine-containing aromatic condensation polymers, 4[a];" *Macromolecular Chemistry and Physics*; vol. 195; 1994; pp. 1877-1889.

Numata et al.; "Re-examination of the relationship between packing coefficient and thermal expansion coefficient for aromatic polyimides;" *Polymer*; vol. 28; 1987; pp. 2282-2288.

Hasegawa et al.; "Spontaneous Molecular Orientation of Polyimides Induced by Thermal Imidization. 2. In-Plane Orientation;" *Macromolecules*; vol. 29; 1996; pp. 7897-7909.

Hasegawa et al.; "Film Properties of Polazomethines;" *Polymer Preprints,* Japan; vol. 52, No. 7; 2003; Extended Abstracts for the Annual Conference of The Society of Polymer Science; p. 1295.

Hasegawa; "Semi-aromatic polyimides with low dielectric constant and low CTE;" *High Performance Polymers*; vol. 13; 2001; pp. S93-S106.

Hasegawa et al.; "Polyimides Containing Trans-1,4-cyclohexane Unit. Polymerizability of their Precursors and Low-CTE, Low-K and High-Tg Properties;" *High Performance Polymers*; vol. 15; 2003; pp. 47-64.

* cited by examiner

*Primary Examiner*—John S Chu
(74) *Attorney, Agent, or Firm*—Oliff & Berridge, PLC

(57) ABSTRACT

Provided are an ester group-containing poly(imide-azomethine)copolymer having low linear thermal expansion coefficient; a production method thereof; an ester group-containing poly(amide acid-azomethine)copolymer to serve as the precursor of the poly(imide-azomethine)copolymer; a positive photosensitive composition including the poly(amide acid-azomethine)copolymer and a photosensitizer; a method for forming a fine pattern of an ester group-containing poly (imide-azomethine)copolymer from the composition; and a method for forming a fine pattern of an ester group-containing poly(imide-azomethine)copolymer by etching a photosensitizer-free, ester group-containing poly(imide-azomethine)copolymer in an alkaline solution. The ester group-containing poly(imide-azomethine)copolymer comprises an ester group-containing azomethine polymer unit of the formula (1) and an imide polymer unit of the formula (2):

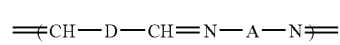

(Chemical formula 1)

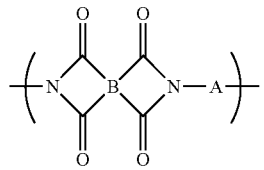

(Chemical formula 2)

wherein in the formulas (1) and (2), A and D are each independently a divalent aromatic or aliphatic group with D containing an ester group; and B is a tetravalent aromatic or aliphatic group.

15 Claims, 5 Drawing Sheets

```
                                    JASCO FT/IR-5300

File Name   :
                            Sample Name: A-7/PAA
                            Resolution : 4
                            Scans      : 16
                            Gain       : 2
                            Apodization: CS
```

Condition
upper 100.00    lower  0.00    depth  2.00

Peak table

| | | | | | |
|---|---|---|---|---|---|
| 1: | 3957.45( 62.6) | 2: | 2932.06( 62.1) | 3: | 1738.02( 24.3) |
| 4: | 1666.65( 26.8) | 5: | 1631.93( 22.6) | 6: | 1599.13( 22.3) |
| 7: | 1533.55( 29.0) | 8: | 1504.61( 31.0) | 9: | 1487.25( 28.0) |
| 10: | 1417.81( 28.5) | 11: | 1319.43( 12.3) | 12: | 1261.56( 10.0) |
| 13: | 1197.90( 14.5) | 14: | 1165.11( 10.2) | 15: | 1124.60( 18.2) |
| 16: | 1074.45( 21.3) | 17: | 1014.65( 42.0) | 18: | 916.27( 56.1) |
| 19: | 841.04( 58.0) | 20: | 785.10( 66.9) | 21: | 754.23( 66.2) |
| 22: | 721.44( 55.4) | 23: | 671.29( 61.8) | 24: | 561.34( 66.7) |

ESTER GROUP-CONTAINING POLY (IMIDE-AZOMETHINE) COPOLYMER, ESTER GROUP-CONTAINING POLY (AMIDE ACID-AZOMETHINE) COPOLYMER, AND POSITIVE PHOTOSENSITIVE RESIN COMPOSITION

BACKGROUND OF THE INVENTION

Field of the Invention

The present invention relates to useful ester group-containing poly(imide-azomethine)copolymers that have relatively low thermal expansion coefficient, relatively high glass transition temperature, and high tenacity. The present invention also relates to methods for producing such copolymers, as well as to ester group-containing poly(amide acid-azomethine)copolymers, which are precursor polymers of poly(imide-azomethine)copolymers. The present invention further relates to positive photosensitive compositions containing such a precursor polymer and a photosensitizer, as well as to fine-patterning methods for forming fine patterns of poly(imide-azomethine)copolymers from the positive photosensitive compositions. The present invention still further relates to fine-patterning methods for forming fine patterns through alkaline etching of photosensitizer-free ester group-containing poly(imide-azomethine)copolymers. 2. Description of the Related Art Heat resistance is an important property of insulators for use in a variety of electronic devices, such as substrates for inflective printed circuit boards, substrates for tape automated bonding, protective films for semiconductor devices, and interlayer insulation films for integrated circuits. Specifically, these insulators are required to withstand the heat during the soldering process. Polyimides are heat-resistant insulators that meet this requirement and are currently used in a wide range of electronic devices.

However, insulators are increasingly used in different applications and, as a result, different properties are now required of these insulators besides heat resistance, including low dielectric constant, low thermal expansion, high transparency, high frequency property (low dielectric loss tangent), low moisture absorbance, high dimension stability, adhesion, and workability. No polyimides currently in use are known to meet these requirements.

The high heat resistance of polyimides is believed to result from their rigid backbones and restricted intramolecular rotation. Among heat resistant polymers other than polyimides that have similar rigid backbones are polyazomethines, compounds produced by polycondensation of dialdehydes and diamines. Polyazomethines are expected to serve as a novel heat resistant insulator.

Due to their rigid structure, however, polyazomethines tend to precipitate in the polymerization system at an early stage of polycondensation while still at a low degree of polymerization. For this reason, it is difficult to obtain polyazomethines with high degree of polymerization (see, Yuki Kagaku Gosei (Organic Synthetic Chemistry), Vol. 41 (1983): pp. 972-984). At low degrees of polymerization, polymer chains of polyazomethines do not get tangled with each other, leading to decreased tenacity of the resulting polymer and, thus, cracking in the cast film. Thus far, few reports have described the characteristics of polyazomethine film.

Several techniques for increasing the degree of polymerization of polyazomethine have been developed. Each of these techniques involves the use of a fluorinated or highly inflective monomer as one of the starting materials of polyazomethine synthesis so that the intermolecular force that acts between the polymer molecules is decreased and the solubility of polyazomethine in the polymerization system is thereby increased (see Macromolecular Chemistry and Physics, Vol. 195 (1994): pp. 1877-1889; Japanese Patent Application Laid-Open No. Sho 64-79233; and Japanese Patent Application Laid-Open No. Hei 2-42372). These techniques are considered to suppress the precipitation of polyazomethine at an early stage of polymerization as well.

In recent years, minimizing the thermal expansion of heat-resistant insulation films has become an important issue for the following reasons: In the production of polyimide film, a soluble precursor of polyimide is dissolved in an amide-based organic solvent because of insolubility of some polyimides in common solvents. This solution is applied to a metal substrate and is dried. The coating is then heated and dehydrated at 250° C. to 350° C. to carry out the ring-closing reaction (imidization reaction) and thereby form a polyimide film. When this polyimide-laminated metal substrate is cooled from imidization temperature to room temperature, thermal stress is generated, which often causes curling, film peeling, cracking, and other serious problems. In addition, the recent trend toward high density electronic circuits has led to increased use of multilayer circuit boards. The residual stress in the multilayer circuit boards significantly decreases the reliability of devices even if the stress is not large enough to cause film peeling and cracking. In general, a larger stress is generated during the imidization process when the difference in the linear thermal expansion coefficient is large between the metal substrate and the polyimide film or when the imidization temperature is high. For these reasons, minimizing the thermal expansion of heat-resistant insulation films is now urgent concern.

With regard to minimization of the thermal expansion of polyimides, a typical polyimide has a linear thermal expansion coefficient of 50 to 90 ppm/K, a significantly larger value as compared to the linear thermal expansion coefficient of a typical metal substrate, such as copper substrate (17 ppm/K). Thus, a study has been conducted in an attempt to decrease the thermal expansion coefficient of polyimide to a close value to the thermal expansion coefficient of copper (for example, approx 20 ppm/K) (see Polymer, Vol. 28 (1987): pp. 2282-2288). The study mentions that in order for a polyimide to have a decreased thermal expansion coefficient, it must have a linear backbone and its internal rotation must be restricted to make the molecule rigid.

Currently most well-known low thermal expansion polyimides for practical use are polyimides formed from 3,3',4,4'-biphenyltetracarboxylic acid dianhydride and paraphenylenediamine. This type of polyimide film is known to have an extremely low thermal expansion coefficient of 5 to 10 ppm/K while the coefficient may vary depending on the film thickness and conditions for film formation (see Macromolecules, Vol. 29 (1996): pp. 7897-7909).

While several other polyimides are also known to exhibit low thermal expansion, each has linear and rigid backbone. For example, polyimides formed from tetracarboxylic acid dianhydrides other than 3,3',4,4'-biphenyltetracarboxylic acid dianhydride, such as pyromellitic dianhydride and 1,2,3,4-cyclobutanetetracarboxylic acid dianhydride, in conjunction with diamines other than p-phenylenediamine, such as 2,2'-bis(trifluoromethyl)benzidine, trans-1,4-cyclohexanediamine, o-tolidine, m-tolidine, and 4,4-diaminobenzanilide, show low thermal expansion.

The low thermal expansion of these polyimide films results from spontaneous in-plane orientation of polyimide chains induced by imidization. Specifically, the initially low in-plane orientation of a polyimide precursor cast on a substrate rapidly increases as the precursor undergoes thermal imidization (see Macromolecules, Vol. 29 (1996): pp. 7897-7909).

The linear and rigid backbones are also essential for polyazomethines to show low thermal expansion property. As previously described, however, the combination of terephthalaldehyde with p-phenylenediamine results in the precipitation of the resulting polymers at an early stage of polymerization. This makes it difficult to obtain highly polymerized products.

While it is possible to obtain a highly polymerized polyazomethine by reacting 2,2'-bis(trifluoromethyl)benzidine, a rigid fluorinated diamine shown by the formula (d) below, with a terephthalaldehyde in m-cresol (see Extended Abstracts for Annual Conference of The Society of Polymer Science, Japan, Vol. 52 (2003), No. 7: p. 1295), the film obtained by casting the resulting polyazomethine becomes highly opaque due to crystallization and is highly brittle.

(Chemical formula d)

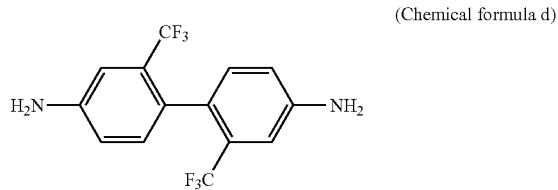

The tenacity of the polyazomethine-cast film can be significantly increased by copolymerizing small amounts of inflective diamines, such as those shown by the formulas (e) and (f) below. The diamines are added in amounts that do not significantly affect the linearity and rigidity of the polymer backbone (see Extended Abstracts for Annual Conference of The Society of Polymer Science, Japan, Vol. 52 (2003), No. 7: p. 1295).

(Chemical formula e)

(Chemical formula f)

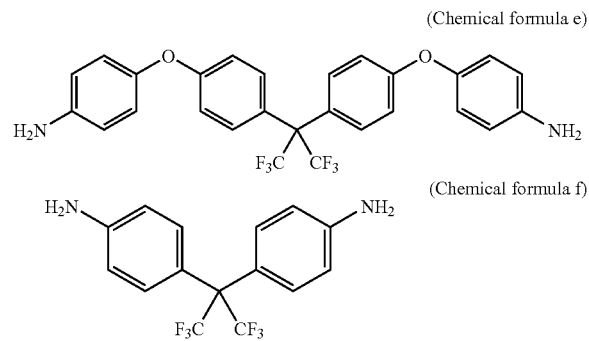

Though rigid, the polyazomethine copolymer films formed of 2,2'-bis(trifluoromethyl)benzidine of the formula (d) as the major diamine component and terephthalaldehyde have a high linear thermal expansion coefficient of 90 ppm/K: They cannot achieve the desired low thermal expansion property (see Extended Abstracts for Annual Conference of The Society of Polymer Science, Japan, Vol. 52 (2003), No. 7: p. 1295). This implies that despite its linear and rigid polymer backbone, the polyazomethine copolymer cannot realize high degree of in-plane orientation in the resulting film when the film is cast by simply evaporating the solvent.

Large amounts of effort have recently been devoted to studying and developing photosensitive polyimides (and precursor polymers thereof) that can significantly reduce the time required to form fine patterns of polyimide films. If polyimides are to be developed such that, in addition to having unique properties not found in common polyimides such as low dielectric constant, low thermal expansion, and high glass transition temperature, they also possesses photosensitivity, such polyimides should serve as a highly useful material for use in the aforementioned industries.

With the recent concern for environment, demand is increasing for positive photosensitive polyimide precursors, which are developed in alkaline solutions, as compared to the negative precursors, which are developed in organic solvents. While the polyimide precursors (polyamide acids) are naturally soluble in alkaline solutions, they can be made alkali-insoluble by dispersing into the polyamide acid film a diazonaphthoquinone photosensitizer (serving as an anti-dissolving agent) to keep the polyamide acid from dissolving. Once the precursor has been made alkali-insoluble, it is exposed to UV-light through a photomask. This causes the photosensitizer in the exposed areas to undergo photoreaction and thus turn into an alkali-soluble indene carboxylic acid. As a result, only the exposed areas dissolve in the alkaline solution, in principle, leaving a positive pattern.

However, polyamide acids are so soluble in an aqueous solution of tetramethylammonium hydroxide, an alkaline developer commonly used with semiconductor resists, that the anti-dissolving agents are not effective enough to prevent the dissolving of polyamide acids and, in many cases, fine patterning is difficult using these polyamide acids. To counteract this problem, polyamide acids may be chemically modified to adjust their solubility in alkaline solutions.

Aside from being able to adjust the solubility of polyamide acids, achieving high transparency of the polyamide acid films is similarly important. For example, when a polyamide acid film is exposed to i-ray (365 nm) from a high-pressure mercury lamp, the polyamide acid, if not transparent enough, may block the irradiation light and prevent it from reaching the photosensitizer. As a result, it takes longer to expose the film and in extreme cases, the photoreaction of the photosensitizer is interrupted to the point where the patterning is no longer possible.

As previously described, the polyimide films formed from 3,3',4,4'-biphenyltetracarboxylic acid dianhydride and p-phenylenediamine are well known for their low thermal expansion. However, the films made of polyamide acids, the precursors of these polyimides, transmit substantially no light in the i-ray range (or block substantially all of the irradiation light) and, thus, cannot be used in photopatterning.

In contrast, the polyamide acid films formed from 3,3',4,4'-biphenyltetracarboxylic acid dianhydride and trans-1,4-cyclohexanediamine have a significantly high transmittance to i-ray (see Japanese Patent Application Laid-Open No. 2002-161136). Moreover, the polyimide films obtained by curing the polyamide acid films have a well-balanced combination of such properties as low thermal expansion, low dielectric constant, and high glass transition temperature (see High Performance Polymers, Vol. 13 (2001): pp. S93-S106; and High Performance Polymers, Vol. 15 (2003): pp. 47-64). Nonetheless, these polyimide precursors are also so highly soluble in alkaline solutions that they cannot be used for photopatterning, either. Thus, a way is sought to make the polyimide precursors practically usable in photopatterning.

As is the case with the above-described positive photosensitive composition, the introduction of large amounts of photosensitizer into resins often causes a decrease in the physical property or the purity of the resin film. For this reason, when heat resistant insulators are used in interlayer insulating films for electronic circuit boards, such as inflective printed circuit boards, or various electronic devices, the use of photosensitizers is often avoided. Instead, conventional photoresists are applied to the heat resistant insulator and are exposed to form desired patterns. The exposed surface of the heat resistant insulator is then etched by, for example, an alkali to form through-holes and other fine features.

However, conventional heat resistant materials such as polyimide, polybenzoxasole, or polyazomethine can be etched by an alkali only at extremely slow rates: Few combinations of heat resistant materials and etching solutions are known to achieve practical etching rates.

SUMMARY OF THE INVENTION

The present invention addresses the above-described problem of the degree of polymerization of polyazomethines, compounds that have high heat resistance comparable to polyimides. It is thus an object of the present invention to provide a polyazomethine copolymer that has a well-balanced combination of such physical properties as low thermal expansion, low dielectric constant, and high glass transition temperature. It is another object of the present invention to provide a production method of such a copolymer. Yet another object of the present invention is to provide a precursor of the polyazomethine copolymer, as well as a positive photosensitive resin composition comprising the precursor of the polyazomethine copolymer and a photosensitizer. Still another object of the present invention is to provide a method for forming fine patterns of the positive photosensitive resin composition, as well as a method for forming such fine patterns by alkali etching without imparting photosensitivity to the polyazomethine copolymer.

The present inventors have discovered that the aforementioned objects can be achieved through the introduction of amide acid residues and ester residues into polyazomethine. The amide acid residues provide reaction sites for intramolecular cyclization and the ester residues provide reaction sites for alkali hydrolysis. It is this discovery that led to the present invention.

Accordingly, the present invention provides an ester group-containing poly(imide-azomethine)copolymer comprising an azomethine polymer unit of the formula (1) and an imide polymer unit of the formula (2):

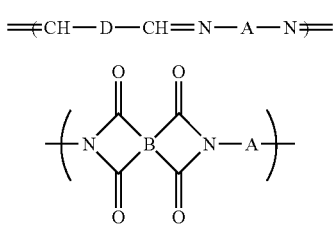
(Chemical formula 1)
(Chemical formula 2)

wherein in the formulas (1) and (2), A and D are each independently a divalent aromatic or aliphatic group with D containing an ester group; and B is a tetravalent aromatic or aliphatic group.

The present invention further provides a method for producing the above-described ester group-containing poly(imide-azomethine)copolymer. This method comprises:

mixing and polymerizing together a diamine of the formula (a), an acid dianhydride of the formula (b), and a dialdehyde of the formula (c):

(Chemical formula a)

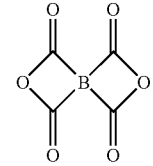
(Chemical formula b)

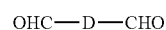
(Chemical formula c)

wherein in the formulas (a), (b) and (c), A and D are each independently a divalent aromatic or aliphatic group with D containing an ester group; and B is a tetravalent aromatic or aliphatic group, to form an ester group-containing poly(amide acid-azomethine)copolymer composed of an ester group-containing azomethine polymer unit of the formula (1) and an amide acid polymer unit of the formula (3):

(Chemical formula 1)

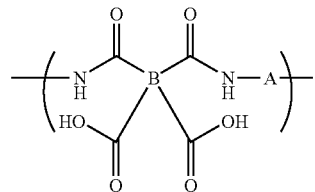
(Chemical formula 3)

wherein in the formulas (1) and (3), A and D are each independently a divalent aromatic or aliphatic group with D containing an ester group; and B is a tetravalent aromatic or aliphatic group; and imidizing the obtained ester group-containing poly(amide acid-azomethine)copolymer to give an ester group-containing poly(imide-azomethine)copolymer.

The present invention also provides an ester group-containing poly(amide acid-azomethine)copolymer to serve as a precursor polymer of the above-described ester group-containing poly(imide-azomethine)copolymer. The ester group-containing poly(amide acid-azomethine)copolymer comprises an azomethine polymer unit of the formula (1) and an amide acid polymer unit of the formula (3):

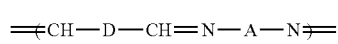
(Chemical formula 1)

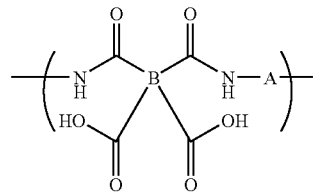
(Chemical formula 3)

wherein in the formulas (1) and (3), A and D are each independently a divalent aromatic or aliphatic group with D containing an ester group; and B is a tetravalent aromatic or aliphatic group.

The present invention further provides a positive photosensitive resin composition containing the above-described ester group-containing poly(amide acid-azomethine)copolymer and a diazonaphthoquinone sensitizer.

The present invention further provides a method for forming a fine pattern of an ester group-containing poly(imide-azomethine)copolymer. The method comprises:

forming the positive photosensitive resin composition into film;

exposing the film of the positive photosensitive resin composition to a pattern of light;

developing the pattern in an alkaline solution; and imidizing the resin composition to make the fine pattern of the ester group-containing poly(imide-azomethine)copolymer.

The present invention further provides a method for forming a fine pattern of an ester group-containing poly(imide-azomethine)copolymer. The method comprises:

depositing a layer of a conventional photoresist over a film of the photosensitizer-free ester group-containing poly(imide-azomethine)copolymer;

exposing the photoresist to a pattern of light;

developing the pattern in an alkaline solution; and etching the exposed surface of the ester group-containing poly(imide-azomethine)copolymer film with an alkaline solution or the like to form the fine pattern of the ester group-containing poly(imide-azomethine)copolymer. The present invention also provides another method for forming a fine pattern of an ester group-containing poly(imide-azomethine)copolymer. The method comprises:

depositing a layer of a conventional photoresist over a film of the above-described ester group-containing poly(amide acid-azomethine)copolymer;

exposing the photoresist to a pattern of light;

developing the pattern in an alkaline solution;

etching the film in an alkaline solution; and imidizing the copolymer to form the fine pattern of the ester group-containing poly(imide-azomethine)copolymer.

The ester group-containing poly(imide-azomethine)copolymer of the present invention is obtained through imidization of an ester group-containing poly(amide acid-azomethine)copolymer. With amide acid residues introduced in its molecule to act as reaction sites for intramolecular cyclization, the poly(amide acid-azomethine)copolymer serves as the precursor of the polyimide. The ester group-containing poly(imide-azomethine)copolymer so obtained has a low thermal expansion. Moreover, the resin composition of the present invention, which comprises the ester group-containing poly(amide acid-azomethine)copolymer and a photosensitizer, not only has a photosensitivity high enough to allow pattern exposure, but also serves as a positive photosensitive resin composition that can be developed in alkaline solutions. The positive photosensitive resin composition can be used to obtain fine patterns of the ester group-containing poly(imide-azomethine)copolymer with a relatively low dielectric constant, relatively low thermal expansion coefficient, and relatively high glass transition temperature. Alternatively, a layer of conventional photoresists may be deposited over a film of the photosensitizer-free, ester group-containing poly(imide-azomethine)copolymer by, for example, coating. Then, pattern exposure and alkali-etching can produce similar fine patterns of the ester group-containing poly(imide-azomethine)copolymer. Fine patterns of the ester group-containing poly(imide-azomethine)copolymer can also be obtained by depositing a layer of conventional photoresists over a film of the ester group-containing poly(amide acid-azomethine)copolymer by, for example, coating, exposing the photoresist layer to light, developing the pattern in an alkali solution and etching the film in an alkali solution, and then imidizing the copolymer.

DETAILED DESCRIPTION OF THE PREFERRED EMBODIMENTS

Figure 1:
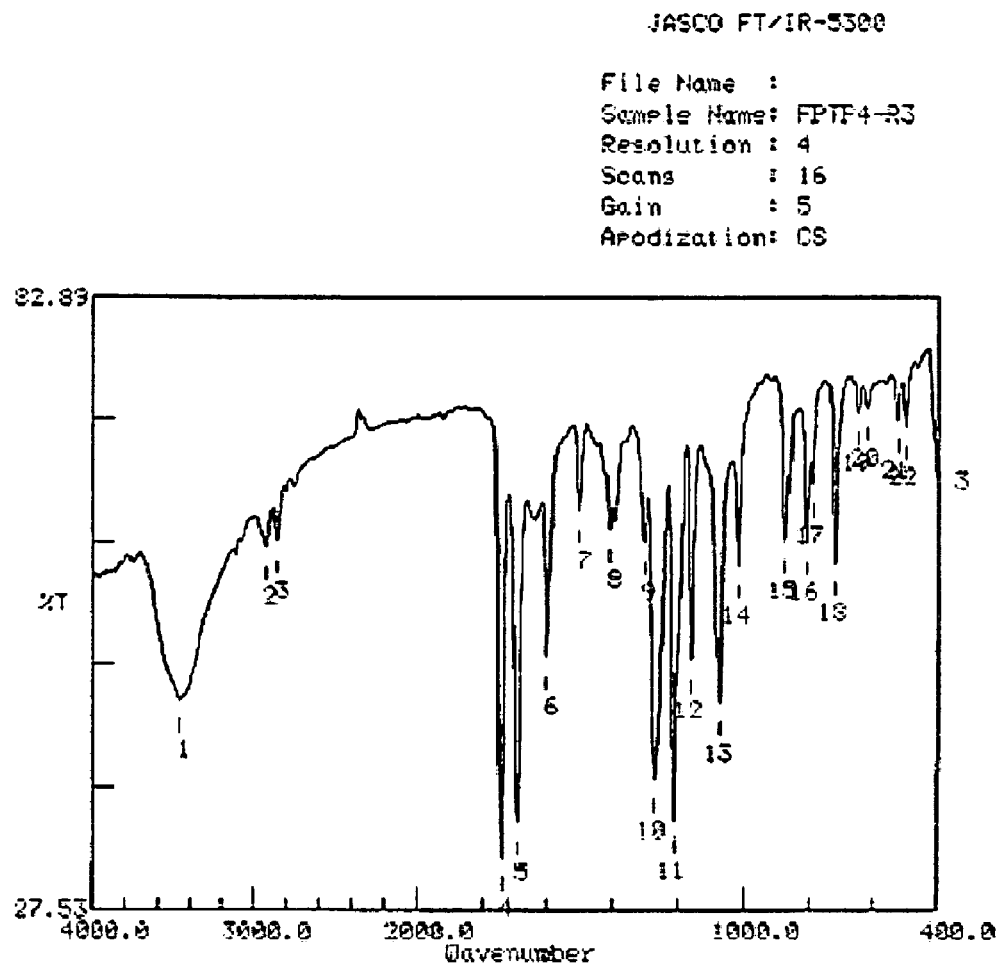
FIG. 1 is an IR absorption spectrum of an ester group-containing dialdehyde of Reference Example 1.

The present invention will now be described in further detail.

The ester group-containing poly(imide-azomethine)copolymer of the present invention is composed of an ester group-containing azomethine polymer unit of the formula (1) and an imide polymer unit of the formula (2). Not only does this copolymer have high heat resistance, but it also has balanced physical properties: a low thermal expansion coefficient of 30 ppm/K, a low dielectric constant, and a high glass transition temperature of 250° C. or above. The amide acid residues present in the unimidized copolymer molecule serve to increase the solubility of the copolymer and thus prevent the formation of precipitate. The unimidized precursor may be mixed with a diazonaphthoquinone photosensitizer to make a positive photosensitive resin composition that can be used in photopatterning. On the other hand, the ester residues in the ester group-containing poly(amide acid-azomethine) copolymer serve to ensure the flexibility of the polymer backbone and prevent the formation of precipitate that often takes place during polymerization of the copolymer. The ester residues in the poly(imide-azomethine)copolymer, the imidized product, serve to facilitate the readiness of the copolymer to be etched by an alkali.

The respective molar fractions of the azomethine polymer unit of the formula (1) and the imide polymer unit of the formula (2) in the ester group-containing poly(imide-azomethine)copolymer should fall in proper ranges since problems arise if the amount of one component is too small as compared to the other. For example, the desired low thermal expansion property may not be obtained if too few imide residues are present, whereas positive photopatterns may not be formed properly if too few azomethine residues are present. The molar fraction of the polymer unit of the formula (1) with respect to the total amount of the polymer unit of the formula (1) and the polymer unit of the formula (2) is preferably in the range of 0.05 to 0.95, and more preferably in the range of 0.1 to 0.9.

As described above, the substituents A and D in the azomethine polymer unit of the formula (1) and the imide polymer unit of the formula (2) each represent a divalent aromatic group or a divalent aliphatic group, with D containing an ester group. The substituent B represents a tetravalent aromatic or aliphatic group.

The divalent aromatic or aliphatic group of the substituent A is a residue that originates from diamines shown by the above-described formula (a), preferably, from a fluorine-containing diamine. Specifically, the residue is a fluorine-containing diamine residue with its two amine groups removed. One particularly preferred example of the substituent A is a residue originating from 2,2'-bis(trifluoromethyl)benzidine, a fluorine-containing diamine shown by the above-described formula (d). The residue originating from the diamine of the formula (d) may be used in conjunction with residues originating from inflective fluorine-containing diamines shown by the above-described formula (e) or (f). In such a case, the proportion of the residues originating from the fluorine-containing diamine of the formula (e) or (f) must be kept within a suitable range since too high a proportion of such residues can lead to a significant increase in the linear thermal expansion coefficient of the poly(imide-azomethine)copolymer. The proportion of the diamine of the formula (d) in the total diamines is preferably at least 50 mol % to ensure high degree of polymerization.

Other examples of the divalent aromatic or aliphatic group of the substituent A other than the above-described residues originating from fluorine-containing diamines include the residues that originate from aromatic diamines or aliphatic diamines, as described below. The proportion of these residues is kept within a suitable range so that the polymerization reactivity of the ester group-containing poly(amide acid-azomethine)copolymer and the required properties of the ester group-containing poly(imide-azomethine)copolymer film are not significantly affected.

Examples of aromatic diamines from which the residue of the substituent A can originate include p-phenylenediamine, m-phenylenediamine, 2,4-diaminotoluene, 2,5-diaminotoluene, 2,4-diaminoxylene, 2,4-diaminodurene, 4,4'-diaminodiphenylmethane, 4,4'-methylene bis(2-methylaniline), 4,4'-methylene bis(2-ethylaniline), 4,4'-methylene bis(2,6-dimethylaniline), 4,4'-methylene bis(2,6-diethylaniline), 4,4'-diaminodiphenyl ether, 3,4'-diaminodiphenyl ether, 3,3'-diaminodiphenyl ether, 2,4'-diaminodiphenyl ether, 4,4'-diaminodiphenylsulfone, 3,3'-diaminodiphenylsulfone, 4,4'-diaminobenzophenone, 3,3'-diaminobenzophenone, 4,4'-diaminobenzanilide, benzidine, 3,3'-dihydroxybenzidine, 3,3'-dimethoxybenzidine, o-tolidine, m-tolidine, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis(4-(3-aminophenoxy)phenyl)sulfone, bis(4-(4-aminophenoxy)phenyl)sulfone, 2,2-bis(4-(4-aminophenoxy)phenyl)propane, 2,2-bis(4-aminophenyl)propane, p-terphenylenediamine, and the like. Two or more different residues originating from these aromatic diamines may be used in combination.

Examples of aliphatic diamines from which the residue of the substituent A can originate include trans-1,4-diaminocyclohexane, cis-1,4-diaminocyclohexane, 1,4-diaminocyclohexane (trans/cis mixture), 1,3-diaminocyclohexane, isophorone diamine, 1,4-cyclohexane bis(methylamine), 2,5-bis(aminomethyl)bicyclo[2.2.1]heptane, 2,6-bis(aminomethyl) bicyclo[2.2.1]heptane, 3,8-bis(aminomethyl)tricyclo[5.2.1.0]decane, 1,3-diaminoadamantane, 4,4'-methylene bis (cyclohexylamine), 4,4'-methylene bis(2-methylcyclohexylamine), 4,4'-methylene bis(2-ethylcyclohexylamine), 4,4'-methylene bis(2,6-dimethylcyclohexylamine), 4,4'-methylene bis(2,6-diethylcyclohexylamine), 2,2-bis(4-aminocyclohexyl) propane, 2,2-bis(4-aminocyclohexyl)hexafluoropropane, 1,3-propanediamine, 1,4-tetramethylenediamine, 1,5-pentamethylenediamine, 1,6-hexamethylenediamine, 1,7-heptamethylenediamine, 1,8-octamethylenediamine, 1,9-nonamethylenediamine, and the like. Two or more different residues originating from these aliphatic diamines may be used in combination.

The tetravalent aromatic or aliphatic group of the substituent B is a residue that originates from tetracarboxylic acid dianhydride shown by the above-described formula (b). Specifically, the residue is a tetracarboxylic acid dianhydride with its four carboxyl groups removed. Among preferred examples of the substituent B are residues originating from pyromellitic dianhydride, 3,3',4,4'-biphenyltetracarboxylic acid dianhydride or 1,2,3,4-cyclobutanetetracarboxylic acid dianhydride. These residues are preferred because they can provide the ester group-containing poly(imide-azomethine) copolymer with low linear thermal expansion coefficient, high glass transition temperature, and sufficient tenacity. These residues are preferably used in combination.

Other examples of the tetravalent aromatic or aliphatic group of the substituent B other than the residues originating from the tetracarboxylic acid dianhydrides of the formula (b) include the residues that originate from the acid dianhydrides, as described below. The proportion of these residues is kept within a suitable range so that the polymerization reactivity of the poly(amide acid-azomethine)copolymer and the required properties of the poly(imide-azomethine)copolymer film are not significantly affected.

Examples of the tetravalent acid dianhydride of the substituent B include 3,3',4,4'-benzophenonetetracarboxylic acid dianhydride, 3,3',4,4'-biphenylethertetracarboxylic acid dianhydride, 3,3',4,4'-biphenylsulfonetetracarboxylic acid dianhydride, 2,2'-bis(3,4-dicarboxyphenyl)hexafluoropropanoic acid dianhydride, 2,2'-bis(3,4-dicarboxyphenyl)propanoic acid dianhydride, 1,4,5,8-naphthalenetetracarboxylic acid dianhydride, and the like. These dianhydrides may be used as the copolymer components either individually or in combination of two or more.

The divalent aromatic or aliphatic group of the substituent D is a residue that originates from ester group-containing dialdehydes shown by the above-described formula (c). Specifically, the residue of the substituent D is a dialdehyde with its two aldehyde groups removed. Preferred examples of the ester group-containing dialdehyde that can provide required properties include ester group-containing dialdehydes shown by the following formula (c') or (c").

(Chemical formula c')

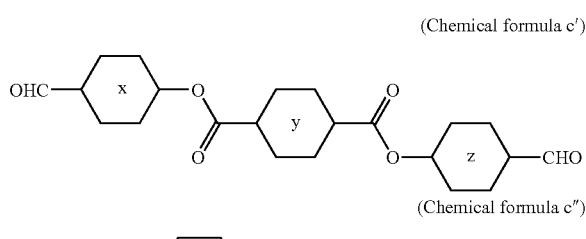

(Chemical formula c")

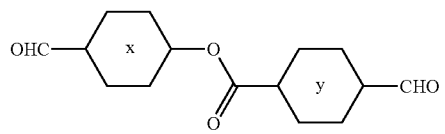

In the formulas (c') and (c"), the six-membered rings x, y, and z are each independently a cyclyhexylene group or a phenylene group.

Preferred examples of the ester group-containing dialdehyde of the formula (c') or (c") include dialdehydes shown by the following formula (g) or (h) in which all of the bonds are at para positions.

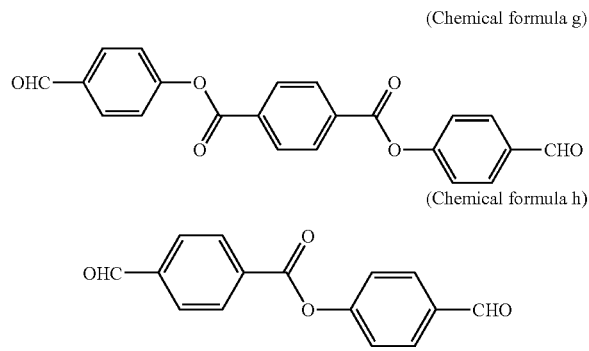

(Chemical formula g)

(Chemical formula h)

Residues originating from other dialdehydes may be used as the divalent aromatic or aliphatic group of the substituent D in conjunction with the residues originating from the ester group-containing dialdehydes shown by the formula (c). The proportion of these residues is kept in a suitable range so that the required properties are not significantly affected. Examples of other dialdehydes from which the substituent D can originate include, but are not limited to, terephthalaldehyde, isophthalaldehyde, 4,4'-diphenylether dialdehyde, 4,4'-diphenylmethane dialdehyde, 4,4'-diphenylsulfone dialdehyde, 1,5-naphthalene dialdehyde, 2,6-naphthalene dialdehyde, and the like.

The above-described ester group-containing poly(imide-azomethine)copolymer of the present invention can be produced by a process comprising the following Steps (I) and (II).

Step (I)

First, the diamine of the formula (a), the acid dianhydride of the formula (b), and the dialdehyde of the formula (c) are mixed and polymerized together to form an ester group-containing poly(amide acid-azomethine)copolymer composed of the azomethine polymer unit of the formula (1) and the amide acid polymer unit of the formula (3). The substituents A, B, and D in the formulas (a), (b), and (c) and in the formula (3) are as described above with reference to the formulas (1) and (2). Specifically, the diamine of the formula (a) is the substituent A of the formula (1) with two amino groups bound to it. The acid dianhydride of the formula (b) is the substituent B of the formula (2) with four carboxyl groups bound to it in the form of anhydride. The dialdehyde of the formula (c) is the substituent D of the formula (1) with two aldehyde groups bound to it.

To be more specific, a diamine of the formula (a), such as 2,2'-bis(trifluoromethyl)benzidine, is dissolved in a solvent such as N-methyl-2-pyrrolidone. To the resulting solution, an acid dianhydride of the formula (b), such as pyromellitic dianhydride, is slowly added and the mixture is stirred at room temperature for 30 min to several hours to make a clear solution. Subsequently, a dialdehyde of the formula (c), such as ester group-containing dialdehyde in the form of powder, is slowly added and the mixture is stirred preferably at room temperature for several hours to several days to carry out polymerization. This gives a uniform and viscous solution of ester group-containing poly(amide acid-azomethine)copolymer. The intrinsic viscosity of the ester group-containing poly(amide acid-azomethine)copolymer is preferably 0.1 dL/g or higher in terms of film tenacity, where the intrinsic viscosity is determined at 30° C. using Ostwald viscometer for an N-methyl-2-pyrrolidone solution of poly(amide acid-azomethine) (0.5 wt %).

The resulting solution of ester group-containing poly(amide acid-azomethine)copolymer may be directly used in the subsequent Step (II), or it may be blended with a photosensitizer to form a positive photosensitive resin composition, which is then used in Step (II). The latter case will be described in more detail later. When the ester group-containing poly(amide acid-azomethine)copolymer is obtained by carrying out the polymerization in a less volatile solvent, such as m-cresol, the polymerization mixture may be properly diluted and then added dropwise to methanol, diethyl ether, toluene, or other poor solvents to cause the poly(amide acid-azomethine)copolymer to precipitate as a powder, which in turn is washed, dried and redissolved in N-methyl-2-pyrrolidone or other solvents for use in the subsequent Step (II).

In this step, the total number of moles of the acid dianhydride of the formula (b) and the dialdehyde of the formula (c) used in the polymerization equals the number of moles of the diamine of the formula (a). By adjusting these molar ratios, the molar ratio of the azomethine polymer unit of the formula (1) to the total amount of the azomethine polymer unit of the formula (1) and the amide acid polymer unit of the formula (3) in the ester group-containing poly(amide acid-azomethine)copolymer can be adjusted to a range of 0.05 to 0.95.

While the degree of the polymerization tends to increase as the monomer concentration in the polymerization mixture (i.e., total concentration of diamine of the formula (a), acid dianhydride of the formula (b) and dialdehyde of the formula (c)) is increased, the monomer concentration is typically adjusted to a range of 5 to 50 wt %, and preferably to a range of 10 to 40 wt % otherwise higher concentration will result in the formation of precipitate of the polymer.

Among preferred solvents for use in this step are N-methyl-2-pyrrolidone, m-cresol, and N,N-dimethylacetamide. Also preferably used are aprotic solvents, such as N,N-diethylacetamide, N,N-dimethylformamide, hexamethyl phoshoramide, dimethylsulfoxide, γ-butyrolactone, 1,3-dimethyl-2-imidazolidinone, 1,2-dimethoxyethane-bis(2-methoxyethyl) ether, tetrahydrofuran, 1,4-dioxane, picoline, pyridine, acetone, chloroform, toluene, xylene, and the like; and protic solvents, such as phenol, o-cresol, p-cresol, o-chlorophenol, m-chlorophenol, p-chlorophenol, and the like. These solvents may be used either individually or as a mixture of two or more.

Step (II)

Next, the resultant ester group-containing poly(amide acid-azomethine)copolymer is imidized using a known imidization technique. This gives an ester group-containing poly (imide-azomethine)copolymer.

Specifically, the ester group-containing poly(amide acid-azomethine)copolymer dissolved in an organic solvent is formed into a thin film using a commonly used coater, such as spin coater. This thin film of the ester group-containing poly (amide acid-azomethine)copolymer is imidized by heating at a temperature of 200° C. to 430° C., preferably at a temperature of 250° C. to 400° C. This process is carried out in the air, in an inert atmosphere such as nitrogen, or in vacuo. Alternatively, the thin film may be imidized by immersing it in acetic anhydride containing a basic catalyst, such as pyridine or triethylamine, for 1 min to several hours. This process is preferably carried out at room temperature. Each of the imidization processes gives a thin film of ester group-containing poly(imide-azomethine)copolymer. If necessary, the organic solvent solution of the ester group-containing poly(amide acid-azomethine)copolymer may contain additives such as oxidation stabilizer, chain stopper, filler, silane-coupling agent, photosensitizer, photopolymerization initiator, sensitizer, and the like.

We now describe a positive photosensitive resin composition that uses the ester group-containing poly(amide acid-azomethine)copolymer obtained in Step (I).

The positive photosensitive resin composition contains the ester group-containing poly(amide acid-azomethine)copolymer, along with a diazonaphthoquinone photosensitizer. Although the ester group-containing poly(amide acid-azomethine)copolymer is by nature soluble in an alkaline solution, it becomes alkali-insoluble when formed into a film with a diazonaphthoquinone photosensitizer dispersed in it, since the diazonaphthoquinone photosensitizer acts to prevent the film from dissolving. However, when the film is exposed to UV rays through a photomask, the diazonaphthoquinone photosensitizer is converted, via a photoreaction, to alkali-soluble indene-carboxylic acid in the exposed areas. Thus, the film becomes alkali-soluble only in the exposed areas, enabling formation of a positive pattern.

Examples of diazonaphthoquinone sensitizer include low molecular weight hydroxylated compounds of 1,2-naphthoquinone-2-diazide-5-sufonic acid and 1,2-naphthoquinone-2-diazide-4-sufonic acid. Specific examples are esters of 2,3, 4-trihydroxybenzophenone, 1,3,5-trihydroxybenzene, 2- and 4-methyl-phenol, 4,4'-hydroxy-propane, and the like.

If too little of the diazonaphthoquinone sensitizer is present in the positive photosensitive resin composition, then the difference in the solubility between the exposed area and the unexposed area becomes too small to develop patterns. On the other hand, too much diazonaphthoquinone sensitizer may adversely affect the physical properties of the film (e.g., tenacity, linear thermal expansion coefficient, glass transition temperature, and heat resistance) and may cause serious problems such as significant decrease in the film thickness following the imidization. Thus, the amount of the diazonaphthoquinone sensitizer is preferably kept in the range of 10 to 40% by weight, and more preferably in the range of 20 to 30% by weight, with respect to the ester group-containing poly(amide acid-azomethine)copolymer.

If necessary, the positive photosensitive resin composition may contain the same organic solvents as described in Step (I).

The positive photosensitive resin composition can be produced by dissolving the diazonaphthoquinone sensitizer in the organic solvent solution of the ester group-containing poly(amide acid-azomethine)copolymer obtained in Step (I).

We now describe a method for producing fine patterns of the ester group-containing poly(imide-azomethine)copolymer by using the positive photosensitive resin composition.

First, the positive photosensitive resin composition is formed into a film. Specifically, the positive photosensitive resin composition diluted with a solvent is applied to a copper, silicon or glass substrate with a spin coater or a bar coater. The coated substrate is placed in a dark environment and is dried at 40 to 100° C. for 0.1 to 3 hours by blowing a hot stream of air. This gives a 1 to 5 μm-thick film of ester group-containing photosensitive poly(amide acid-azomethine)copolymer. This film-forming process is preferably carried out at 100° C. or below. At temperatures above 100° C., the diazonaphthoquinone sensitizer may start to thermally decompose. The coated substrate may be prebaked at 80 to 100° C. for 1 to 30 min to remove residual solvents. The same effect can be obtained by immersing the substrate in water for 1 to 5 min. The residual solvents can cause swelling of the film or crumbling of the resulting pattern during the development and should thus be removed as much as possible to obtain well-defined patterns.

The resulting film of ester group-containing poly(amide acid-azomethine)copolymer is exposed to a pattern of light, developed in an alkaline solution, and then imidized to obtain desired fine patterns of ester group-containing poly(imide-azomethine)copolymer.

To be more specific, the film is exposed to an i-ray from a high-pressure mercury lamp via a photomask for 10 sec to 1 hour at room temperature and is then developed in a 0.05 to 10 wt %, preferably 0.1 to 5 wt % aqueous solution of tetramethylammonium hydroxide for 10 sec to 10 min at room temperature. Rinsing the developed film with pure water gives well-defined positive patterns. The resulting fine patterns of the poly(amide acid-azomethine)copolymer formed on the substrate is then thermally imidized at a temperature of 200° C. to 430° C., preferably at 250° C. to 400° C., either in the air, in an inert gas atmosphere such as nitrogen, or in vacuo. This gives well-defined fine patterns of ester group-containing poly(imide-azomethine)copolymer with a linear thermal expansion coefficient of less than 30 ppm/K and a glass transition temperature of 250° C. or above.

The imidization process may be chemically performed using a dehydration/cyclization reagent. For example, the film of the ester group-containing poly(amide acid-azomethine)copolymer formed on the substrate may be immersed in acetic anhydride containing a basic catalyst such as pyridine and triethylamine for 1 min to several hours at room temperature. This also gives the film of ester group-containing poly(imide-azomethine)copolymer.

We now describe one method for producing fine patterns of the ester group-containing poly(imide-azomethine)copolymer of the present invention. In this method, the ester group-containing poly(imide-azomethine)copolymer is etched using a photoresist.

First, the ester group-containing poly(amide acid-azomethine)copolymer is made into a film. Specifically, the ester group-containing poly(amide acid-azomethine)copolymer diluted with a solvent is applied to a copper, silicon, or glass substrate with a spin coater or a bar coater. The coated substrate is dried at 40 to 100° C. for 0.1 to 3 hours by, for example, blowing a hot stream of air. This gives a 1 to 5 μm-thick film of ester group-containing poly(amide acid-azomethine)copolymer.

Next, the resulting film of the ester group-containing poly (amide acid-azomethine)copolymer is imidized by a known imidization technique and a layer of photoresist is deposited over the resulting film. Specifically, negative resists such as commercially available dry film and photosolder resist ink may be used for this purpose. Positive resists using diazonaphthoquinone compounds may also be used.

The resulting photoresist layer is exposed to a pattern of light and is then developed. Subsequent etching of the film of the ester group-containing poly(imide-azomethine)copolymer with an alkaline solution gives desired fine patterns of the copolymer. The alkali etching of the poly(imide-azomethine) copolymer film may be carried out at 80° C. using a 50 wt % aqueous solution of sodium hydroxide. Poly(imide-azomethine)copolymer films are readily etched with alkaline solutions only when they contain ester groups.

Described next is another method for producing fine patterns of the ester group-containing poly(imide-azomethine) copolymer. In this method, the ester group-containing poly (amide acid-azomethine)copolymer is first etched using a photoresist, and the etched film is then imidized.

First, the ester group-containing poly(amide acid-azomethine)copolymer is formed into a film. Specifically, the ester group-containing poly(amide acid-azomethine)copolymer diluted with a solvent is applied to a copper, silicon or glass substrate with a spin coater or a bar coater. The coated substrate is dried at 40 to 100° C. for 0.1 to 3 hours by, for example, blowing a hot stream of air. This gives a 1 to 5 μm-thick film of ester group-containing poly(amide acid-azomethine)copolymer.

Next, a layer of photoresist is deposited over the resulting film of the poly(amide acid-azomethine)copolymer. Specifically, negative resists such as commercially available dry film and photosolder resist ink may be used for this purpose. Positive resists using diazonaphthoquinone compounds may also be used. Positive resists using diazonaphthoquinone compounds may also be used.

The resulting photoresist layer is exposed to a pattern of light and is then developed. Subsequently, the film of the ester group-containing poly(amide acid-azomethine)copolymer is etched with an alkaline solution and is then imidized by a known imidization technique. This gives desired fine patterns of ester group-free poly(imide-azomethine)copolymer film.

EXAMPLES

The present invention will now be described in further detail with reference to examples, which are not intended to limit the scope of the invention in any way. Parameters used in Examples and Comparative Examples are determined by analytical techniques described below.

<Intrinsic Viscosity ([η] dL/g)>

The intrinsic viscosity of a 0.5 wt % solution of ester group-containing poly(amide acid-azomethine)copolymer was determined at 30° C. using Ostwald viscometer. The intrinsic viscosity is preferably 0.1 dL/g or higher to ensure tenacity of the film.

<Glass Transition Temperature (Tg)>

Using a thermomechanical analyzer TMA4000 (Brucker AX Co.), the glass transition temperature of a film of ester group-containing poly(imide-azomethine)copolymer was determined from the peak loss obtained in the analysis of dynamic viscoelasticity (frequency=0.1 Hz, temperature increased at a rate of 5° C./min). The glass transition temperature (Tg) is preferably 250° C. or above to ensure heat resistance during soldering.

<5% Weight Loss Temperature ($Td^5$)>

Using a thermogravimeter TG-DTA2000 (Brucker AX Co.), the change in the thermogravity of a film of ester group-containing poly(imide-azomethine)copolymer was determined to obtain the temperature at which the weight of the film was decreased by 5%. The 5% weight loss temperature ($Td^5$) is preferably 400° C. or above to ensure heat resistance of the film.

<Coefficient of Linear Thermal Expansion (CTE)>

Using a thermomechanical analyzer TMA4000 (Brucker AX Co.), thermomechanical analysis was conducted to determine linear thermal expansion coefficient. Specifically, the expansion of a test piece was determined by applying a load of 0.5 g/1 μm film thickness and increasing temperature at a rate of 5° C./min, and the average was determined for the 100 to 200° C. range. The linear thermal expansion coefficient (CTE [ppm/K]) is preferably lower than 30 ppm/K to minimize the residual stress in electronic device materials, in particular insulation film/metal substrate used in FPCs and multilayered circuit boards.

<Dielectric Constant>

Using an Abbe refractometer Abbe 4T (ATAGO), the dielectric constant (∈) at 1 MHz was obtained by the equation $\in = 1.1 \times (n_{av})^2$ (where $n_{av}$=average refraction index of polyimide film=$(2n_{in}+n_{out})/3$). The dielectric constant (∈) is preferably as small a value as possible to maximize the speed of electric signal transmission in electronic devices. The dielectric constant of 3.0 or less is preferred.

<IR Absorption Spectrum>

To confirm the molecular structure of the synthesized ester group-containing dialdehyde, the IR absorption spectrum of the synthetic product was obtained by KBr technique using an IR spectrometer FT-IR5300 (JASCO).

<$H^+$-NMR Spectrum>

To confirm the molecular structure of the synthesized ester group-containing dialdehyde, $H^+$-NMR spectrum of the synthetic product was obtained in deuterodimethylsulfoxide or deuterochloroform using an NMR spectrometer ECP400 (JEOL).

<Differential Scanning Calorimetry (Melting Point and Melting Curve)>

Using a differential scanning calorimeter DSC3100 (Brucker AX Co.), the melting point and the melting curve of the synthesized ester group-containing dialdehyde were determined in a nitrogen atmosphere while temperature was increased at a rate of 2° C./min.

Reference Example 1

Synthesis of Ester Group-Containing Dialdehyde (bis(4-formylphenyl)terephthalate)

Terephthalic acid dichloride (10 mmol) was dissolved in anhydrous tetrahydrofuran in a dried eggplant flask and the vessel was sealed with a septum cap. The concentration of the solute was 10 wt %. To a separate eggplant flask, 4-hydroxybenzaldehyde (20 mmol) and pyridine (70 mmol) were placed, followed by anhydrous tetrahydrofuran to dissolve the compounds, and the vessel was sealed with a septum cap (solute conc.=10 wt %). Using a syringe, this solution was slowly added dropwise to the solution of terephthalic acid dichloride. The mixture was stirred for 1 hour in an ice bath and then for 12 hours at room temperature.

Figure 2:
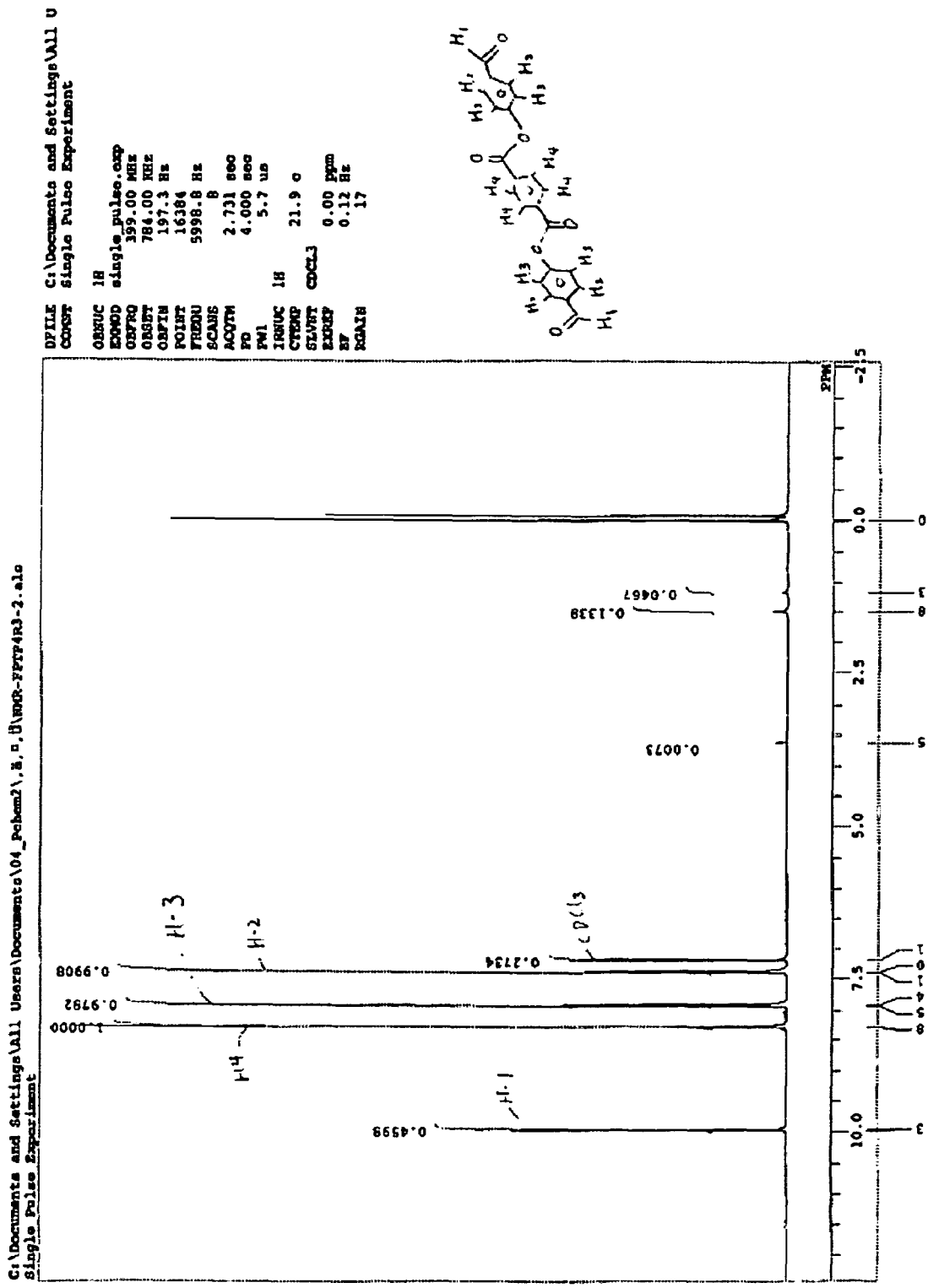
FIG. 2 is an $H^+$ NMR spectrum of the ester group-containing dialdehyde of Reference Example 1.
Figure 3:
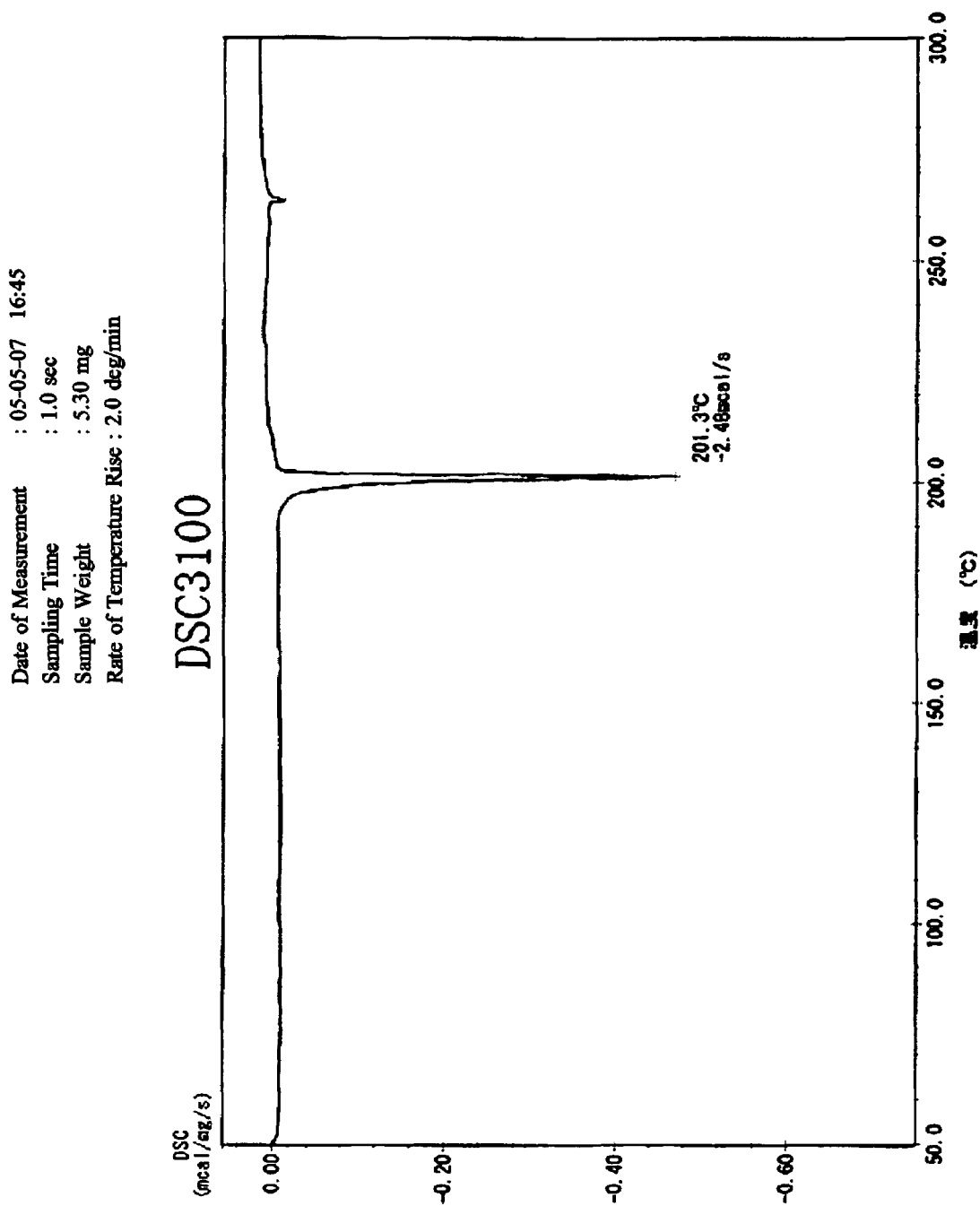
FIG. 3 is a differential scanning calorimetry curve of the ester group-containing dialdehyde of Reference Example 1.

Upon completion of the reaction, the resultant white precipitate (mixture of desired product and pyridine hydrochloride) was filtered and washed with copious amount of water to give a white powder (71% yield of crude product). This product was recrystallized from dioxane to give white needle crystal. This product was identified by IR spectrometry (KBr) and $H^+$ NMR as the ester group-containing dialdehyde shown by the formula (g). The DSC analysis showed a single sharp absorption peak at 201° C. (melting point), indicating high purity of the product. FIGS. 1 through 3 show IR absorption spectrum, $H^+$ NMR spectrum, and DSC curve, respectively.

Reference Example 2

Synthesis of Ester Group-Containing Dialdehyde (4-formylphenyl-4'-formylbenzoate)

4-formylbenzoic acid was chlorinated as follows: 4-formylbenzoic acid (20 mmol) was placed in a dried eggplant flask equipped with a reflux condenser. An excess amount of thionyl chloride was added to the flask and the mixture was refluxed at 100° C. for 6 hours in a nitrogen atmosphere. Subsequently, thionyl chloride was distilled out, followed by addition of anhydrous benzene to completely remove thionyl chloride by azeotropic distillation. This gave 4-formylbenzoic acid chloride as a white powder. The IR absorption spectrum of this white powder showed no absorption bands indicative of carboxylic acid but showed an absorption peak indicative of an acid chloride group, indicating quantitative chlorination.

This obtained product, or 4-formylbenzoic acid chloride (10 mmol), was then dissolved in anhydrous tetrahydrofuran in a dried eggplant flask equipped with a reflux condenser and the vessel was sealed with a septum cap. The concentration of the solute was 10 wt %. To a separate eggplant flask, 4-hydroxybenzaldehyde (10 mmol) and pyridine (70 mmol) were placed, followed by anhydrous tetrahydrofuran to dissolve the compounds, and the vessel was sealed with a septum cap (solute conc.=10 wt %). Using a syringe, this solution was slowly added dropwise to the solution of 4-formylbenzoic acid chloride. The mixture was stirred for 1 hour in an ice bath and then for 12 hours at room temperature.

Upon completion of the reaction, the resultant white precipitate (pyridine hydrochloride) was removed by filtration. The filtrate was concentrated in an evaporator and was added dropwise to copious amount of water for washing. The crystallized white powder was filtered (72% yield). The product was identified by IR spectrometry (KBr) and $H^+$ NMR as the ester group-containing dialdehyde shown by the formula (h) The DSC analysis showed a single sharp absorption peak at 127° C. (melting point), indicating high purity of the product.

Example 1

(Preparation of Ester Group-Containing poly(imide-azomethine)copolymer film Through Polymerization and Imidization of Ester Group-Containing poly(amide acid-azomethine)copolymer, and Evaluation of Film Properties)

2,2'-bis(trifluoromethyl)benzidine (10 mmol) was dissolved in thoroughly dehydrated N-methyl-2-pyrrolidone in a dried sealed reaction vessel equipped with a stirrer. To this solution, pyromellitic dianhydride powder (5 mmol) was slowly added and the mixture was stirred at room temperature for several hours. Subsequently, powder of the ester group-containing dialdehyde of the formula (g) described in Reference Example 1 (5 mmol) was added, and the mixture was stirred at room temperature for 72 hours to give a uniform, viscous ester group-containing poly(amide acid-azomethine) copolymer. Polymerization was carried out at a monomer concentration of 30 wt %. The intrinsic viscosity of the resulting ester group-containing poly(amide acid-azomethine)copolymer determined in N-methyl-2-pyrrolidone (NMP) at 30° C. was 0.184 dL/g.

Figure 4:
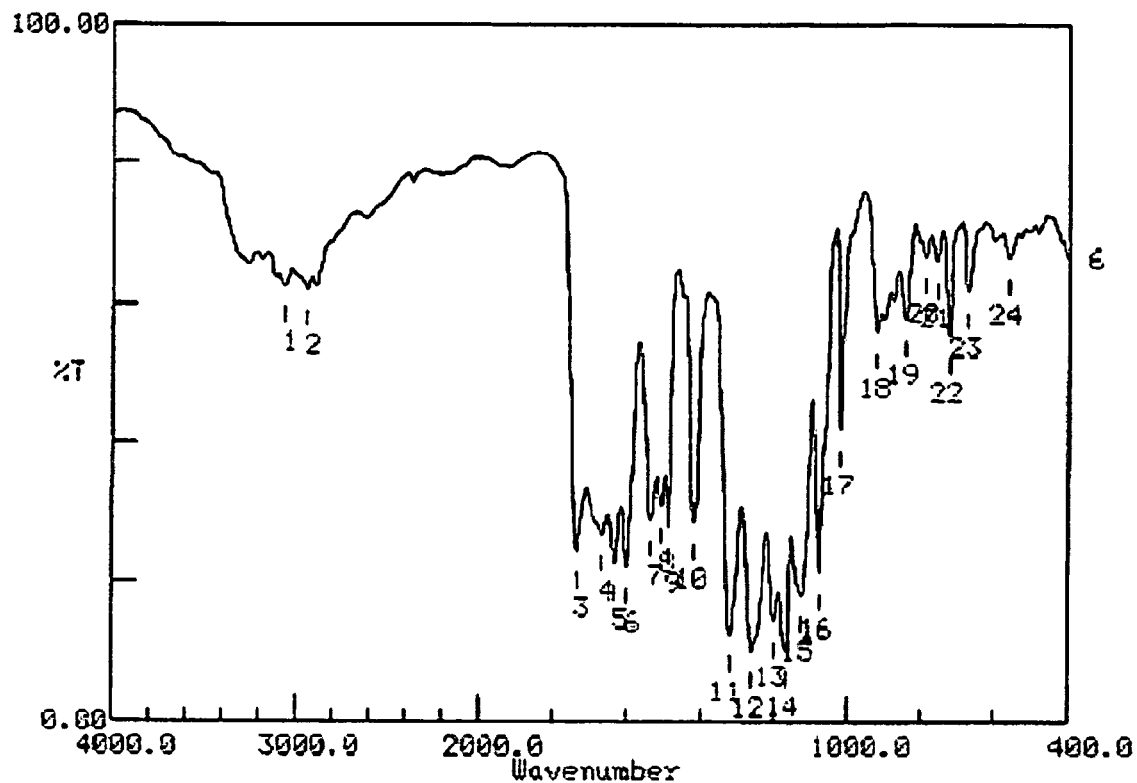
FIG. 4 is an IR absorption spectrum of an ester group-containing poly(amide acid-azomethine)copolymer of Example 1.
Figure 5:
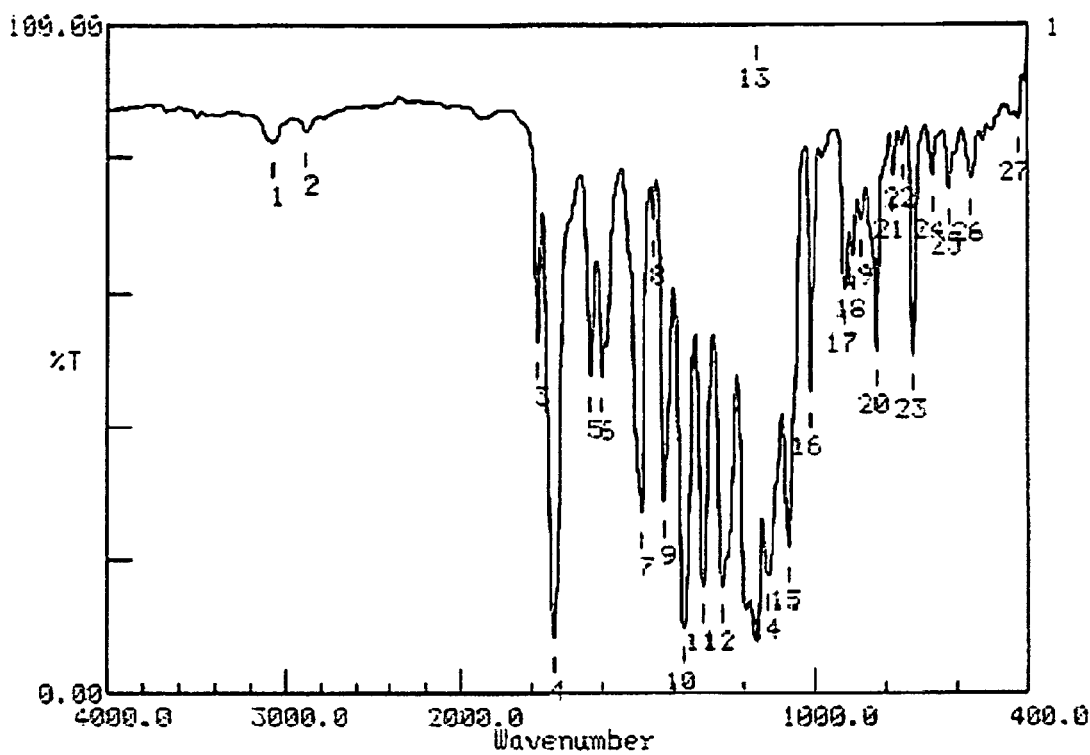
FIG. 5 is an IR absorption spectrum of ester group-containing poly(imide-azomethine)copolymer film of Example 1.

The solution of the ester group-containing poly(amide acid-azomethine)copolymer was diluted to 25 wt %. The solution was poured on the surface of a glass substrate and was allowed to spread over the surface. The spread solution was dried at 60° C. for 2 hours to form a relatively fragile transparent film of poly(amide acid-azomethine)copolymer. FIG. 4 shows the IR absorption spectrum of the ester group-containing poly(amide acid-azomethine)copolymer. In FIG. 4, absorption peaks for the amide acid hydroxide group, aromatic ester, and azomethine are found near 3000 $cm^{-1}$, 1735 $cm^{-1}$, and 1630 $cm^{-1}$, respectively. This film was thermally imidized on the substrate at 250° C. for 1 hour under a reduced pressure and was subsequently heated at 330° C. for 1 hour. This gave a 10 to 20 μm-thick strong film of ester group-containing poly(imide-azomethine)copolymer. FIG. 5 shows the IR spectrum of this ester group-containing poly(imide-azomethine)copolymer film. In FIG. 5, the absorption peak for the amid acid hydroxide group near 3000 $cm^{-1}$ has disappeared and absorption peaks for the aromatic ester, imide carbonyl, and azomethine are found near 1735 $cm^{-1}$, 1780 $cm^{-1}$, and 1630 $cm^{-1}$, respectively.

The IR spectrum indicated that the thermal imidization reaction was substantially completed during the initial thermal imidization process performed at 250° C. for 2 hours. The subsequent heating at 330° C. for 1 hour caused no changes in the IR absorption spectrum, indicating that substantially no structural changes had occurred during this process. This heating process significantly increased the tenacity of the film, however. This is thought to be because heating at high temperature had caused solid phase polymerization between terminal groups (extension of the polymer chain), resulting in an increase in the molecular weight. The film had a relatively low linear thermal expansion coefficient (29 ppm/K), a relatively high glass transition temperature (approx. 247° C.), and 5% weight loss temperatures of 472° C. in nitrogen and 448° C. in the air. These figures indicate high thermal stability of the film. The film also had a relatively low dielectric constant of 2.97. Thus, the resulting film of ester group-containing poly(imide-azomethine)copolymer proved to have all of the required properties.

Example 2

An ester group-containing poly(amide acid-azomethine) copolymer was obtained in the same manner as in Example 1, except that the ester group-containing dialdehyde described in Reference Example 2 was used in place of the ester group-containing dialdehyde described in Reference Example 1. The intrinsic viscosity of the copolymer was determined to be 0.166 dL/g.

This ester group-containing poly(amide acid-azomethine) copolymer was made into a film and imidized according to the method described in Example 1 and the film properties were evaluated. The film had an extremely low linear thermal expansion coefficient (−0.81 ppm/K), a relatively high glass transition temperature (260° C.), and 5% weight loss temperatures of 437° C. in nitrogen and 433° C. in the air. The film also had a relatively low dielectric constant of 3.03. It had a cut-off wavelength of 392 nm, a tensile elasticity of 6.34 GPa, an elongation at break of 14%, and a strength at break of 0.205 GPa. The moisture absorption was an extremely low value of 0.33%.

Example 3

2,3,4-tris(1-oxo-2-diazonaphthoquinone-5-sulfoxy)benzophenone to serve as a diazonaphthoquinone sensitizer was dissolved in an N-methyl-2-pyrrolidone solution of the ester group-containing poly(amide acid-azomethine)copolymer described in Example 1. The amount of the diazonaphthoquinone sensitizer was 30 wt % of the amount of the poly (amide acid-azomethine)copolymer. The solution was applied to a silicon wafer surface-treated with a silane-coupling agent. The coating was dried in a hot air drier at 60° C. for 2 hours to form a 4 to 5 μm-thick film-like layer of a photosensitive polymer layer. The photosensitive polymer layer was prebaked at 80° C. for 10 min and was then exposed through a photomask to an i-ray emitted from an incident-light type high pressure mercury lamp and passed through an interference filter, for 5 min. The intensity of irradiation was approximately 3 mW/$cm^2$. The exposed photosensitive polymer layer was developed at 25° C. for 1 to 6 min in a 0.5 wt % aqueous solution of tetramethylammonium hydroxide, rinsed with water, and dried at 60° C. for several minutes. The polymer layer was then heated stepwise at 250° C. for 1 hour and then for 1 hour at 330° C. in vacuo to carry out thermal imidization. This gave a well-defined pattern with a line width of 20 μm.

Comparative Example 1

2,2'-bis(trifluoromethyl)benzidine (4.5 mmol) and 2,2'-bis(4-(4-aminophenoxy)phenyl)hexafluoropropane (0.5 mmol) were dissolved in thoroughly dehydrated m-cresol in a dried sealed reaction vessel equipped with a stirrer. To this solution, terephthalaldehyde powder (5 mmol) was added and the mixture was stirred at room temperature for 24 hours to obtain a uniform viscous polyazomethine copolymer. The intrinsic viscosity determined in N-methyl-2-pyrrolidone at 30° C. was 0.481 dL/g.

The resulting solution of polyazomethine copolymer was applied to a glass substrate. The coating was dried at 60° C. for 2 hours and was subsequently heated under reduced pressure at 250° C. for 1 hour on the substrate to form a 10 to 20 μm-thick strong transparent polyazomethine copolymer film. The film had a glass transition temperature of 269° C. and a 5% weight loss temperature in nitrogen of 445° C., indicating relatively high heat resistance. However, the film had a high linear thermal expansion coefficient of 97 ppm/K and failed to achieve the desired low thermal expansion. This is because reaction sites required for imidization did not exist during the polymerization because of the absence of dianhydride, such as pyromellitic dianhydride, and evaporating the solvent during film casting is not effective enough to promote in-plane orientation of the polymer chains. This was also the case when the dialdehyde of the formula (g) described in Reference Example 1 was used in place of terephthalaldehyde.

Comparative Example 2

2,2-bis(4-(4-aminophenoxy)phenyl)hexafluoropropane and pyromellitic dianhydride were polymerized to give a polyimide precursor. The polyimide precursor was determined to have a intrinsic viscosity of 0.696 dL/g.

The resulting solution of polyimide precursor was applied to a glass substrate. The coating was dried at 60° C. for 2 hours and was subsequently heated under reduced pressure at 250° C. for 1 hour on the substrate to form a 10 to 20 μm-thick strong transparent polyimide film. The film had a glass transition temperature of 278° C. and a 5% weight loss temperature in nitrogen of 534° C., indicating relatively high heat resistance. However, the film had a high linear thermal expansion coefficient of 61 ppm/K and failed to achieve the desired low thermal expansion. The low birefringence of 0.0093 signifies that the high linear thermal expansion coefficient results from the polyimide chains substantially not oriented in-plane. The polyimide chains are hardly oriented in-plane because the diamine used has flexibility and as a result, the polymer backbones substantially lack the linearity and rigidity required for the imidization-induced in-plane orientation of polyimide chains.

The ester group-containing poly(imide-azomethine)copolymer of the present invention is obtained by imidization of an ester group-containing poly(amide acid-azomethine)copolymer, a polyimide precursor that includes in its molecule amide acid residues to serve as the reaction sites for intramolecular cyclization. Accordingly, the ester group-containing poly(imide-azomethine)copolymer of the present invention has a reduced thermal expansion. The resin composition comprising the ester group-containing poly(amide acid-azomethine)copolymer and a photosensitizer can make a positive photosensitive resin composition that not only shows a photosensitivity high enough for pattern exposure, but can also be developed in alkaline solutions. The positive photosensitive resin composition can be used to form fine patterns of the ester group-containing poly(imide-azomethine)copolymer that have a low dielectric constant, low thermal expansion coefficient and high glass transition temperature. Furthermore, the photosensitizer-free ester group-containing poly(imide-azomethine)copolymer can be etched in alkaline solutions to form fine patterns. For these reasons, the poly(imide-azomethine)copolymer of the present invention can be used in protective films for semiconductor devices, interlayer insulation films for integrated circuits, and various other electronic devices.

The entire disclosure of the specification, claims, summary and drawings of Japanese Patent Application Nos. 2005-151607, 2005-270479 and 2005-271953, filed on May 24, 2005, Sep. 16, 2005 and Sep. 20, 2005 are respectively, hereby incorporated by reference.

What is claimed is:

1. An ester group-containing poly(imide-azomethine)copolymer comprising an azomethine polymer unit of the formula (1) and an imide polymer unit of the formula (2):

(Chemical formula 1)

(Chemical formula 2)

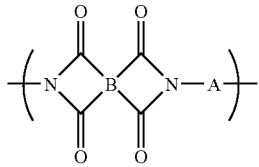

wherein in the formulas (1) and (2), A and D are each independently a divalent aromatic or aliphatic group with D containing an ester group; and B is a tetravalent aromatic or aliphatic group.

2. The ester group-containing poly(imide-azomethine)copolymer according to claim 1, wherein a molar fraction of the polymer unit of the formula (1) with respect to a total amount of the polymer unit of the formula (1) and the polymer unit of the formula (2) is in a range of 0.05 to 0.95.

3. The ester group-containing poly(imide-azomethine)copolymer according to claim 1 that has a linear thermal expansion coefficient of less than 30 ppm/K and a glass transition temperature of 250° C. or above.

4. A method for producing the ester group-containing poly(imide-azomethine)copolymer according to claim 1, comprising:

mixing and polymerizing together a diamine of the formula (a), a tetracarboxylic acid dianhydride of the formula (b) and a dialdehyde of the formula (c):

(Chemical formula a)

-continued

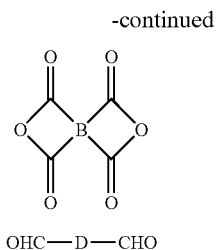
(Chemical formula b)

OHC—D—CHO (Chemical formula c)

wherein in the formulas (a), (b) and (c), A and D are each independently a divalent aromatic or aliphatic group with D containing an ester group; and B is a tetravalent aromatic or aliphatic group, to form an ester group-containing poly(amide acid-azomethine)copolymer composed of an ester group-containing azomethine polymer unit of the formula (1) and an amide acid polymer unit of the formula (3):

=CH—D—CH=N—A—N= (Chemical formula 1)

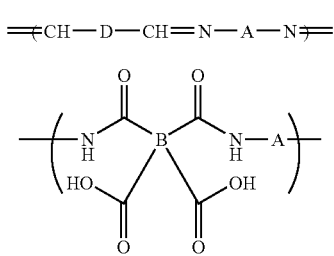
(Chemical formula 3)

wherein in the formulas (1) and (3), A and D are each independently a divalent aromatic or aliphatic group with D containing an ester group; and B is a tetravalent aromatic or aliphatic group; and imidizing the obtained ester group-containing poly(amide acid-azomethine)copolymer to give an ester group-containing poly(imide-azomethine)copolymer.

5. The method according to claim 4, wherein a molar fraction of the polymer unit of the formula (1) with respect to a total amount of the polymer unit of the formula (1) and the polymer unit of the formula (3) is in a range of 0.05 to 0.95.

6. The method according to claim 4, wherein the diamine of the formula (a) and the acid dianhydride of the formula (b) are mixed and reacted with each other, and the dialdehyde of the formula (c) is subsequently mixed with the reaction mixture for reaction.

7. An ester group-containing poly(amide acid-azomethine) copolymer, comprising an azomethine polymer unit of the formula (1) and an amide acid polymer unit of the formula (3):

=CH—D—CH=N—A—N= (Chemical formula 1)

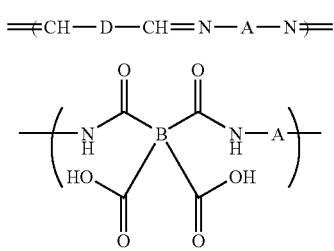
(Chemical formula 3)

wherein in the formulas (1) and (3), A and D are each independently a divalent aromatic or aliphatic group with D containing an ester group; and B is a tetravalent aromatic or aliphatic group.

8. The ester group-containing poly(amide acid-azomethine)copolymer according to claim 1, wherein a molar fraction of the polymer unit of the formula (1) with respect to a total amount of the polymer unit of the formula (1) and the polymer unit of the formula (2) is in a range of 0.05 to 0.95.

9. The ester group-containing poly(amide acid-azomethine)copolymer according to claim 7 that has an intrinsic viscosity of 0.1 dL/g or higher.

10. A positive photosensitive resin composition comprising the ester group-containing poly(amide acid-azomethine) copolymer according to claim 7 and a diazonaphthoquinone sensitizer.

11. The positive photosensitive resin composition according to claim 10, wherein an amount of the diazonaphthoquinone sensitizer with respect to an amount of the ester group-containing poly(amide acid-azomethine)copolymer is 10 to 40% by weight.

12. A method for forming a fine pattern of an ester group-containing poly(imide-azomethine)copolymer, comprising:

forming the positive photosensitive resin composition according to claim 10 into film;

exposing the film of the positive photosensitive resin composition to a pattern of light;

developing the pattern in an alkaline solution; and imidizing the resin composition to make the fine pattern of the ester group-containing poly(imide-azomethine)copolymer.

13. The method according to claim 12, wherein the ester group-containing poly(imide-azomethine)copolymer has a linear thermal expansion coefficient of less than 30 ppm/K and a glass transition temperature of 250° C. or above.

14. A method for forming a fine pattern of an ester group-containing poly(imide-azomethine)copolymer, comprising:

depositing a layer of a photoresist over a thin film of the ester group-containing poly(imide-azomethine)copolymer according to claim 1;

exposing the photoresist to a pattern of light;

developing the photoresist; and etching the thin film of the ester group-containing poly (imide-azomethine)copolymer with an alkaline solution to form the fine pattern.

15. A method for forming fine pattern of ester group-containing poly(imide-azomethine)copolymer, comprising:

depositing a layer of a photoresist over a thin film of the ester group-containing poly(amide acid-azomethine)copolymer according to claim 7;

exposing the photoresist to a pattern of light;

developing the pattern in an alkaline solution;

etching the film in an alkaline solution; and imidizing the copolymer to form the fine pattern of the ester group-containing poly(imide-azomethine)copolymer.

* * * * *